US007782813B2

(12) United States Patent
Wheeler et al.

(10) Patent No.: US 7,782,813 B2
(45) Date of Patent: Aug. 24, 2010

(54) MONITORING NETWORK TRAFFIC

(75) Inventors: Andrew James Wheeler, Boston, MA (US); Dewitt Clinton Seward, IV, Arlington, MA (US); Jonathan Everett Avey, Boston, MA (US)

(73) Assignee: Ember Corporation, Boston, MA (US)

( * ) Notice: Subject to any disclaimer, the term of this patent is extended or adjusted under 35 U.S.C. 154(b) by 1491 days.

(21) Appl. No.: 11/063,261

(22) Filed: Feb. 22, 2005

(65) Prior Publication Data
US 2005/0249122 A1 Nov. 10, 2005

Related U.S. Application Data

(63) Continuation-in-part of application No. 10/457,205, filed on Jun. 9, 2003, now abandoned.

(60) Provisional application No. 60/386,925, filed on Jun. 7, 2002, provisional application No. 60/546,041, filed on Feb. 19, 2004.

(51) Int. Cl.
*H04L 12/26* (2006.01)

(52) U.S. Cl. ............... 370/328; 370/338; 370/401; 709/224

(58) Field of Classification Search .......... 370/252, 370/328, 338, 400, 401; 709/223, 224
See application file for complete search history.

(56) References Cited

U.S. PATENT DOCUMENTS

| | | | |
|---|---|---|---|
| 4,332,027 A | 5/1982 | Malcolm et al. | |
| 4,939,726 A | 7/1990 | Flammer et al. | |
| 4,974,224 A | 11/1990 | Boone | |
| 5,901,362 A | 5/1999 | Cheung et al. | |
| 6,028,857 A | 2/2000 | Poor | |
| 6,301,244 B1 | 10/2001 | Huang et al. | |
| 6,307,843 B1 | 10/2001 | Okanoue | |
| 6,363,384 B1 | 3/2002 | Cookmeyer, II et al. | |
| 6,674,738 B1 | 1/2004 | Yildiz et al. | |
| 6,693,888 B2 * | 2/2004 | Cafarelli et al. | 370/338 |
| 6,885,643 B1 * | 4/2005 | Teramoto et al. | 370/252 |
| 7,039,017 B2 * | 5/2006 | Sherlock | 370/252 |
| 7,215,659 B1 * | 5/2007 | Chen et al. | 370/338 |
| 7,277,404 B2 * | 10/2007 | Tanzella et al. | 370/310 |

(Continued)

FOREIGN PATENT DOCUMENTS

EP 0 568 737 11/1993

(Continued)

OTHER PUBLICATIONS

Banerjee and Khuller, *A Clustering Scheme for Hierarchical Control in Multi-hop Wireless Networks*, INFOCOM, p. 1028-1037 (2001).

(Continued)

*Primary Examiner*—Pankaj Kumar
*Assistant Examiner*—Duc T Duong
(74) *Attorney, Agent, or Firm*—Nields, Lemack & Frame, LLC

(57) ABSTRACT

A method for monitoring a wireless network includes, at a device including a communication interface coupling the device to a wireless network, monitoring messages transmitted between the communication interface and the wireless network, and outputting monitoring data associated with the monitored messages from the device.

7 Claims, 14 Drawing Sheets

U.S. PATENT DOCUMENTS

| | | | |
|---|---|---|---|
| 7,382,756 B2 * | 6/2008 | Barber et al. | 370/338 |
| 2001/0012300 A1 | 8/2001 | Raisanen | |
| 2002/0049561 A1 | 4/2002 | Garcia-Luna-Aceves et al. | |

FOREIGN PATENT DOCUMENTS

| | | |
|---|---|---|
| EP | 1 113 645 | 7/2001 |
| WO | WO 83/01359 | 4/1983 |
| WO | WO 99/33232 | 7/1999 |
| WO | WO 01/63849 | 8/2001 |

OTHER PUBLICATIONS

Biagioni, Edoardo, *PODS: Interpreting Spatial and Temporal Environmental Information*, (2001).

Chu et al., *Scalable Information-Driven Sensor Querying and Routing for ad hoc Heterogeneous Sensor Networks*, Int. Jour. of High Perf. Computing App. In 2002. Accessed on the Internet at URL http://www2.parc.com/spl/projects/cosense/pub/idsg.pdf on May 1, 2002.

Conner et al., *Making Everyday Life Easier Using Dense Sensor Networks*. Proceedings of ACM Ubicomp, Atlanta Georgia, Oct. 2001.

Dube et al., *Signal Stability based Adaptive Routing (SSA) for Ad-Hoc Mobile Networks* (Feb. 1997).

Gutierrez et al., *IEEE 802.15.4: A Developing Standard for Low-Power Low-Cost Wireless Personal Area Networks*, IEEE Network (Sep./Oct. 2001).

Hill, Jason, *A Software Architecture Supporting Networked Sensors*, Masters Research Project—University of CA/Berkeley (2000).

Hubaux et al., *The Terminode Project: Towards Mobile Ad-Hoc WANs*, In Proc. of Workshop on Mobile, Multimedia Conference, San-Diego, CA (1999).

IEEE 802.15.4 Overview (Nov. 2001).

Lee et al., *A Performance Comparison Study of Ad Hoc Wireless Multicast Protocols*, INFOCOM, p. 565-574 (2000).

Lee et al., *On-Demand Multicast Routing Protocol in Multihop Wireless Mobile Networks*, Mobile Networks and Applications, 0 p. 1-16 (2001).

Lee, Sung-Ju, *Routing and Multicasting Strategies in Wireless Mobile Ad hoc Networks*, PhD dissertation—University of California (2000).

Mauve et al., *A Survey on Position-Based Routing in Mobile Ad Hoc Networks*, IEEE Network (Nov./Dec. 2001).

Perkins et al., *Ad hoc On-Demand Distance Vector (AODV) Routing*, Internet Draft/Mobile Ad Hoc Networking Working Group, (Jan. 19, 2002).

Poor, Rober D., *Gradient Routing in Ad Hoc Networks*, accessed on Internet at URL http://www.media.mit.edu/pia/Research/ESP/texts/poorieeepaper.pdf on May 1, 2002. (2000).

Poor, Robert D., *Embedded Networks: Pervasive, Low-Power, Wireless Connectivity*, MIT PhD Thesis (Jan. 2001).

Poor, Robert D., *Hyphos: A Self-Organizing, Wireless Network*, MIT Masters Thesis (1997).

Ramanathan, S. and Steenstrup, M., *A Survey of Routing Techniques for Mobile Communication Networks*, Mobile Network and Applications, vol. 1, No. 2, p. 89-104 (1996).

Royer and Toh, *A Review of Current Routing Protocols for Ad hoc Mobile Wireless Networks*, IEEE Personal Communications (Apr. 1999).

Notification of Transmittal of the International Search Report and the Written Opinion of the International Searching Authority, or the Declaration. PCT/US05/005373, (Jun. 30, 2006).

\* cited by examiner

Send Packet from Originating Node:

0110   IF unicast packet THEN

0120        ENQUEUE packet with accrued_cost=0, rem_cost=cost[dest], and Ack req. cleared

0130        REPEAT

0140                TRANSMIT packet

0150                DELAY retransmit_time

0170        UNTIL detected forwarding of packet with rem_cost≤cost[dest] or Ack with rem_cost<cost[dest]

0180   ELSE *(it is a broadcast packet)*

0190        ENQUEUE packet with accrued_cost=0, and radius set

0200        REPEAT n_broadcast TIMES

0210                TRANSMIT packet

0220                DELAY rebroadcast_time

0230        END REPEAT

0240   ENDIF

0250   DEQUEUE packet

FIG. 3

Process Received Packet

0310  RECEIVE packet for dest with link cost LC

0320  IF packet flagged to update cost table THEN
0330      IF the packet has not already been received with
                lower accrued_cost + LC THEN
0330          SET cost[src] = received accrued_cost + LC
0340      ENDIF
0340  ENDIF 0350  IF packet was received by packet dest THEN
0360      Process Packet at Destination Node
0380  ELSE IF packet is flagged as a unicast packet THEN
0390      Process Unicast Packet at Intermediate Node
0400  ELSE
0410      Process Broadcast Packet
0420  ENDIF

FIG. 4

Process Packet at Destination node:

0510  TRANSMIT Ack with rem_cost=0

FIG. 5

Process Unicast Packet at Intermediate Node

0610   IF cost[dest] is unknown or cost[dest] ≥ rem_cost THEN DISCARD packet

0620   IF the node has already forwarded the packet OR
        the node detected forwarding or Ack of
            the packet by another node with rem_cost<cost[dest] THEN 0630      TRANSMIT Ack with rem_cost=cost[dest]

0660      DISCARD packet

0670   ELSE

0680      SET progress = packet rem_cost – cost[dest];

0690      ENQUEUE packet with accrued_cost = received accrued_cost + LC,
          and rem_cost = cost[dest]

0700      SET delay according to progress *(higher progress ⇔ lower delay)*

0710      REPEAT

0720         DELAY random duration in range [0,delay]

0730         IF no detected forwarding or Ack
              with rem_cost<cost[dest] THEN 0740           TRANSMIT packet 0750           DELAY retransmit_time 0760           SET Ack req'd in packet

0790         ENDIF

0800      UNTIL detected forwarding of packet or Ack with rem_cost<cost[dest]

0810      DEQUEUE packet

0820   ENDIF

FIG. 6

Process Broadcast Packet

| | |
|---|---|
| 0901 | IF radius ≤ 1 THEN DISCARD packet |
| 0905 | IF update costs flag is set THEN |
| 0910 |     IF the node has already received the packet and begun forwarding it with an equal or lower accrued_cost THEN |
| 0920 |         DISCARD packet |
| 0930 |     ELSE |
| 0935 |         SET cost[origin] = accrued_cost + receive link cost LC |
| 0940 |         SET delay according to received link cost LC<br>        (*lower cost ⇔ lower delay*) |
| 0950 |         ENQUEUE packet with radius decremented by 1 and accrued_cost = received accrued_cost + LC |
| 0950 |         REPEAT n_broadcast TIMES |
| 0960 |             DELAY random duration in range [0,delay] |
| 0970 |             IF the node has not received the packet such that it would be forwarded with a lower accrued_cost THEN |
| 0980 |                 TRANSMIT packet |
| 0990 |             ENDIF |
| 1000 |         UNLESS node has received the packet with a lower accrued_cost |
| 1010 |         DEQUEUE packet |
| 1020 |     ENDIF |
| 1030 | ELSE *(update costs flag not set)* |

FIG. 7A

| | |
|---|---|
| 1040 | IF the node has already received the packet THEN |
| 1050 |     DISCARD packet |
| 1060 | ELSE |
| 1070 |     ENQUEUE packet with radius decremented by 1 and accrued_cost = received accrued_cost + LC |
| 1080 |     REPEAT n_broadcast TIMES |
| 1090 |         TRANSMIT packet |
| 1100 |         DELAY rebroadcast_time |
| 1110 |     END REPEAT |
| 1120 | ENDIF |
| 1130 | ENDIF |

FIG. 7B

MONITORING NETWORK TRAFFIC

CROSS-REFERENCE TO RELATED APPLICATIONS

This application is a continuation-in-part of U.S. application Ser. No. 10/457,205, filed Jun. 9, 2003, now abandoned which claims the benefit of U.S. Provisional Application No. 60/386,925, filed Jun. 7, 2002; and this application claims the benefit of U.S. Provisional Application No. 60/546,041, filed Feb. 19, 2004; each of which is incorporated herein by reference.

BACKGROUND

This invention relates to monitoring network traffic.

Network devices such as network protocol analyzers (also known as "packet sniffers") are able to monitor traffic within a network from nodes of the network within the same network segment (or "broadcast domain") as the network protocol analyzer. For example, if the network protocol analyzer is attached to a shared medium (e.g., a bus or a hub) the network protocol analyzer can receive and decode all packets that are transmitted from nodes directly connected to the shared medium including packets addressed for other nodes. In some cases, if a device such as a switch lies between the network protocol analyzer and a transmitting node, the network protocol analyzer does not receive traffic from that node.

SUMMARY

In one aspect, in general, the invention features a method, and an associated apparatus, for monitoring a network. The method includes, at a device including a communication interface coupling the device to a network, monitoring messages transmitted between the communication interface and the network, and outputting monitoring data associated with the monitored messages from the device.

The method can include one or more of the following features.

The network is a wireless network.

The messages include radio messages.

The messages include frames formatted according to a medium access control layer format.

The communication interface performs data link layer functions, and/or medium access control layer functions.

The communication interface includes a radio receiver.

Outputting monitoring data includes outputting the monitoring data onto a wired network.

The monitoring data includes a copy of a transmitted or received frame.

The monitoring data includes at least one of a time-stamp, a received signal strength indicator, a link quality indicator, or a receiver gain.

In another aspect, in general, the invention features a method for monitoring a network that includes: transmitting and receiving radio messages at nodes of a wireless network, linking the nodes using a second network, generating monitoring data associated with the radio messages at the nodes, and collecting the monitoring data from the nodes over the second network.

The method can include one or more of the following features.

The second network includes a wired network.

The monitoring data includes a copy of a transmitted or received frame.

The monitoring data includes at least one of a time-stamp, a received signal strength indicator, a link quality indicator, or a receiver gain.

In another aspect, in general, the invention features a system for monitoring a wireless network. The system includes a plurality of nodes each having a radio transceiver for transmitting and receiving radio messages, a communications medium linking the nodes, and a monitoring station coupled to the communications medium. The monitoring station is configured to receive monitoring data associated with radio messages among the nodes over the communications medium.

The system can include one or more of the following features.

The communications medium includes a wired communications medium.

The monitoring data includes a copy of a transmitted or received frame.

The monitoring data includes at least one of a time-stamp, a received signal strength indicator, a link quality indicator, or a receiver gain.

Aspects of the invention can include one or more of the following advantages:

Monitoring messages within a wireless network over a second network coupled to the nodes enables a monitoring station to determine which nodes transmitted and/or received those messages.

Displaying monitoring information associated with the same event enables a user to visualize the flow of information through the network based on events such as delivery of a packet from an origin to a destination.

Data collected from nodes of a wireless network over a second network is useful for monitoring and testing the wireless network.

A common format for network simulation messages and network monitoring messages facilitates debugging and performance modeling and evaluation.

Other features and advantages of the invention are apparent from the following description, and from the claims.

DESCRIPTION OF DRAWINGS

FIG. 3 is pseudocode for a procedure to send a packet from a originating node.

FIG. 4 is pseudocode for a procedure to process a received packet.

FIG. 5 is pseudocode for a procedure to process a received packet at the destination node.

FIG. 6 is pseudocode for a procedure to process a received unicast packet at an intermediate node.

FIGS. 7A-B are pseudocode for a procedure to process a received broadcast packet.

DESCRIPTION

1 GRADIENT ROUTING APPROACH

Figure 1:
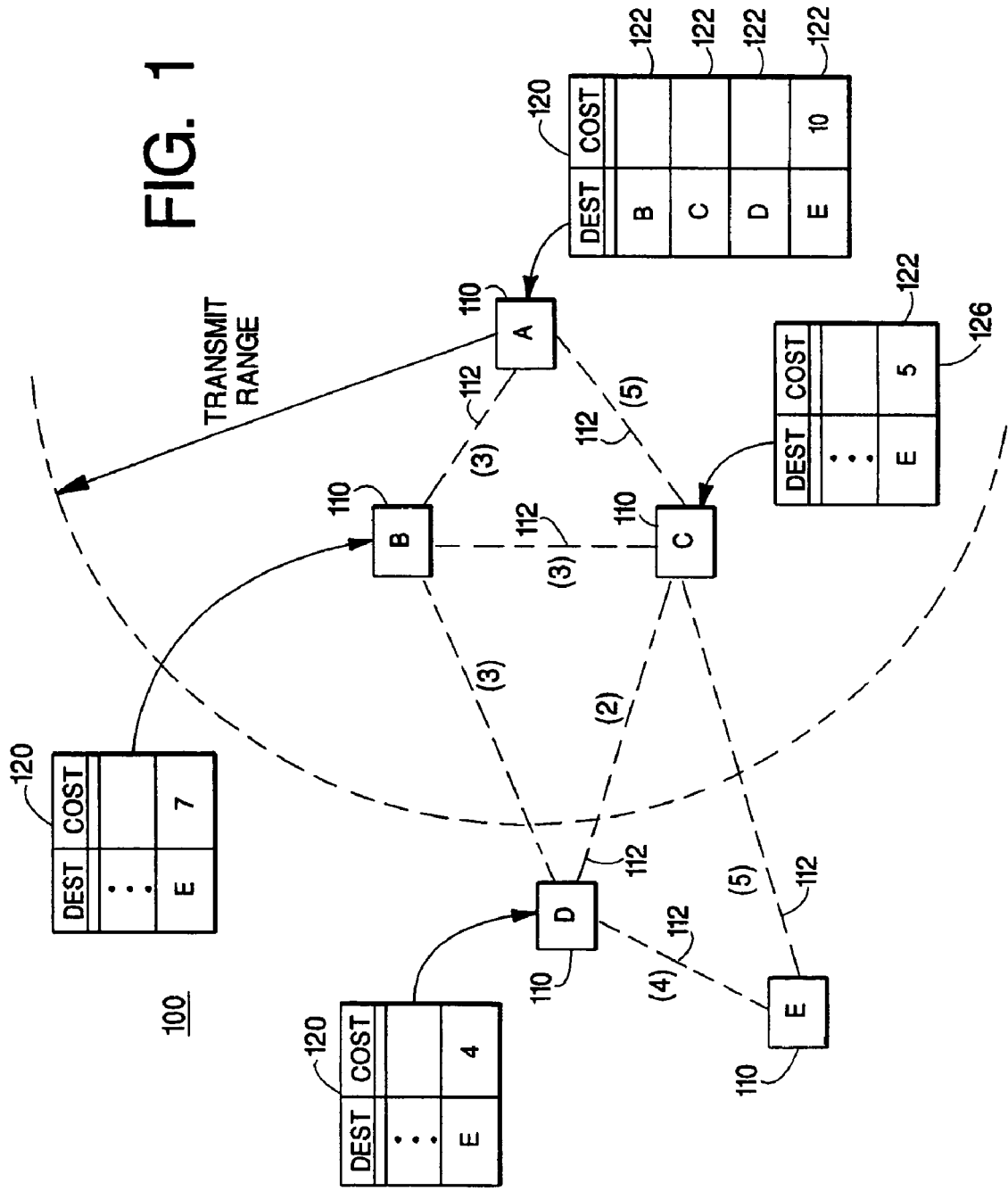
FIG. 1 is a diagram of a wireless network.

Referring to FIG. 1, a wireless network 100 includes a number of wireless nodes 110. In the example that is shown, nodes 110 are identified as nodes A-E. Not all pairs of nodes can necessarily communicate directly, and therefore data packets that pass through wireless network 100 generally take paths that pass through a number of intermediate nodes in a multi-hop routing approach. Routing of packets in wireless network 100 uses a gradient approach. Furthermore, an originating or intermediate node does not necessarily send each outgoing packet to a particular next node on a route to the ultimate destination for the packet. Rather, nodes transmit packets such that, in general, any of a number of nodes that receive the packet may forward the packet to its destination. As is described further below, the routing approach includes features that reduce the number of transmission needed to pass a packet from an origin node to a destination node.

In wireless network 100 shown in FIG. 1, nodes that are able to communicate directly with one another are indicated by a dashed line 112 joining the nodes. For example, nodes B and C are within node A's transmit range, and therefore can receive data from node A. In the discussion below, connectivity between nodes is generally assumed to be symmetrical (that is, for any pair of nodes, both nodes can receive transmissions from the other, or neither can). However, the version of the routing protocol described below will continue to function correctly in the presence of asymmetric links, as long as any two nodes are connected by a path consisting of symmetric links, and alternative versions of the routing protocol may not require such connectivity.

As part of the routing protocol, each node 110 maintains a cost table 120. Each cost table has a number of records (rows) 122, each row being associated with different particular destination node. Cost table 120 includes two columns: one column 124 identifies the destination, and another column 126 represents a cost of sending a packet from the node maintaining the table to the corresponding destination. The costs are positive quantities that represent that node's estimate of the lowest cost path through the network to the destination. The cost of a path includes additive terms corresponding to each of the links along the path. The cost of a link is inversely related to the link reliability. Reliability of a link can be estimated using any of a variety of techniques. For example, reliability of a link can be estimated by keeping track of the signal-to-noise ratio (SNR) of packets arriving at a node from a neighboring node over that link. In general, shorter links typically have lower cost because of the relatively higher signal strength than longer links. This version of the routing protocol does not rely on the link reliability being estimated as equal at the nodes of the link, and alternative versions of the protocol explicitly account for asymmetrical link reliability.

Any of a variety of physical (PHY) and media access control (MAC) layers may be used. In one implementation, nodes 110 communicate according to a proposed IEEE 802.15.4 standard. A direct sequence spread spectrum (DSSS) communication technique is used in the unlicensed 2.4 GHz ISM (Industrial, Scientific, and Medical) band. Use of spread spectrum communication avoids interference with other communication systems in the same band, including Bluetooth (IEEE 802.15.1) and Wireless LANS using the IEEE 802.11b standard. Alternative PHY and MAC layers that support concurrent transmission of packets from one node to multiple neighboring nodes can be used in an equivalent manner.

Figure 2:
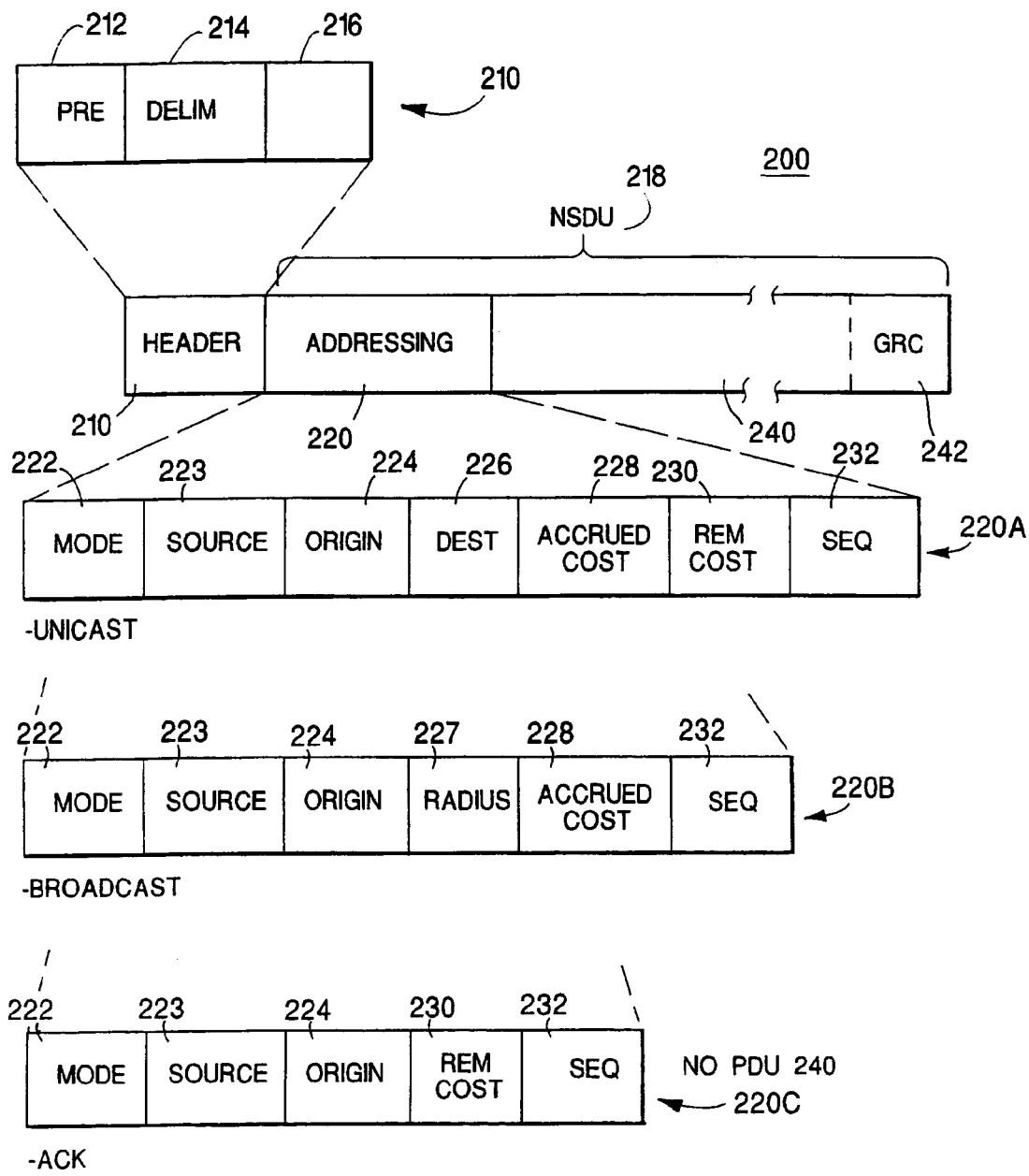
FIG. 2 is a diagram of a data packets.

Referring to FIG. 2, data is transmitted between nodes use a packet format in which each packet 200 includes a physical layer header 210 and a remainder of the packet that forms a network service data unit (NSDU) 218. Header 210 includes a preamble 212, which is used for synchronization of the spread spectrum communication, a packet delimiter 214, and a packet length 216. NSDU 218 includes an addressing section 220 and a packet data unit (PDU) 240, as well as an optional CRC 242.

Addressing section 220 includes information that is used for routing packets through the network. Addressing section 220 includes a mode 222, which includes an indicator whether the packet is a unicast packet, broadcast packet, or an acknowledgment packet, and an indicator of whether intermediate nodes should update their cost tables based on this packet. As shown in the lower portion of FIG. 2, in addressing sections 220A-C, the format of the addressing section depends on the mode of packet.

For a unicast packet, addressing section 220A includes an identification of the origin node 224 and the destination node 226 for the packet, a sequence number 232 for packets sent from the origin node and an identification of source node 223 which transmitted the packet on the last link. In this version of the protocol nodes are identified in the header by unique node numbers in a range 1-255. Addressing section 220 also includes an accrued cost 228 from the origin to the source and a remaining cost 230 from the source to the destination for the packet. The costs are represented as integers in a range 0-255. The procedure for setting the accrued and remaining costs is described further below.

For a broadcast packet, addressing section 220B does not include a destination, but rather includes a radius 227 is used to count the number of hops the packet has taken from its origin. As the broadcast packet is not addressed to a particular destination, the addressing section does not include a remaining cost field.

Addressing section 220C for an acknowledgment packet includes source 223, origin 224, remaining cost 230, and sequence number 232.

2. EXAMPLES

Several examples of packet forwarding according to the gradient routing approach are discussed below with reference to FIGS. 3 to 7A-B. These examples illustrate the procedures that are followed in transmitting and receiving packets. For simplicity, in the discussion below, a single "packet" is associated with a particular origin node and sequence number at that node. When a node is said to receive a packet, or multiple copies of the packet, this means that the node has received an instance of a packet with the particular origin node and sequence number. When important, the various instances (i.e., transmissions or retransmissions) of the packet are distinguished in the discussion. Note also that the procedures shown in FIGS. 3 to 7A-B each relate to processing a single packet. However, each node may concurrently process multiple packets according to the procedures.

2.1 Example 1

In a first example, a node A 110 transmits a unicast packet destined for node E 110. The packet is not flagged to update the cost tables as the packet traverses the network. In this example, each node of the network includes an record 122 in its cost table 120 for destination E. For illustration, link costs for the links are indicated in FIG. 1 in parentheses, and the minimum costs in cost table 120 at each node is the minimum total costs along the shortest path to destination E.

Source node A 110 initializes addressing section 220 of packet 200A destined for node E with its own identification in source node 223 and origin node 224 and node E's identification in destination node 226. Node A initializes accrued cost 228 to zero and remaining cost 230 to the cost to destination E retrieved from its cost table 120, which in this example is a cost of 10. This packet is flagged as a unicast packet that is not to be used to update cost tables. Node A increments its packet sequence number and puts that sequence number in sequence number field 232 and enqueues the packet in an outbound packet queue.

Referring to the procedure shown in FIG. 3, the packet is a unicast packet (line 0110) therefore originating node A 110 executes an initial sequence of steps at lines 0120-0170 in the procedure. First, node A passes the packet to a MAC layer for transmission (line 0140). Note that depending on the particular MAC and PHY layer, this step may in fact result in several attempted transmissions, for example, if collisions are detected when individual transmission are attempted.

The MAC layer does not provide a guarantee that the packet has been received by any neighboring node. Therefore, node A waits a retransmission time (line 0150). If before the expiration of the retransmission time, node A has either detected that another node closer to the destination has already forwarded the packet, or has received an explicit acknowledgement that the packet was forwarded by some node close to the destination (line 0170) then the node dequeues the packet (line 0250). As is discussed below, when a node forwards the packet, it re-writes the remaining cost field 230. By examining this field, node A can determine whether the node has indeed been forwarded by a closer node to the destination than itself. Similarly, explicit acknowledgement packets include a remaining cost field which is used for the same purpose. Node A repeats the steps of transmitting the packet and waiting (lines 140-150) until it detects the suitable forwarding or acknowledgment, or a retry limit is reached.

In this example, nodes B and C are in range of transmission from node A and both receive the packet. Referring to the procedure shown in FIG. 4, each node receives the packet and measures the received SNR, averaging it with SNR values previously detected from node A. The SNR is used to determine the link cost, LC. In this version of the system, the link cost is set to an integer in the range of 1 to 7.

If the packet is flagged to update the cost tables at receiving nodes (line 0320), the receiving node may update its cost table based on the cost of the reception. This updating procedure and the circumstances under which the node updates its cost table are discussed further below. In this example, the packet from node A is not flagged to update the cost tables and nodes B and C are not the ultimate destination of the packet and therefore processing of the receiving packet at each of nodes B and C continues at line 0350 with execution of the procedure to process a unicast packet at an intermediate node (line 0390).

Referring to the procedure shown in FIG. 6, each intermediate node (i.e. nodes B and C in this example) that receives a packet first determines whether it should forward (retransmit) the packet, and if so delays retransmitting the packet for a period of time that depends on how much "progress" toward the ultimate destination the packet has made on its last transmission. Specifically, processing of the received unicast packet begins with a check to see if the receiving node has an entry in its cost table with the remaining cost to the destination of the received packet (line 0610). If the node does not have an entry, the node discards the packet without forwarding it. If it does have an entry, but its entry for the destination indicates that it is farther from the destination than the previous transmitter of the packet, then the node also discards the packet. In this example, both node B and node C are have lower remaining cost to destination E than is indicated in the received packet, and therefore neither discards the packet.

At this point in the example, on receiving the first transmission of the packet, neither node B nor node C has already forwarded the packet nor detected another node acknowledging the packet (line 0620) therefore processing of the received packet continues at line 0680.

Next each node computes the progress of the packet on its last hop (line 0680). The progress is defined as the difference between the remaining cost indicated in the received packet and the remaining cost in the cost table of the node computing the progress. A packet that has traveled on a higher cost link will in general have a higher computed progress. The progress of a packet is generally related to the cost of the reception on the last link (i.e., greater progress for lower SNR is typically corresponding to a longer distance), although due to variation in signal characteristics or dynamic changes in the cost tables, the progress is not necessarily equal to the last link cost.

Having computed the progress, nodes B and C then both enqueue the packet (line 0690). The accrued cost in the enqueued packet is incremented according to the last link cost, and the remaining cost is set equal to the node's entry in its cost table for the ultimate destination of the packet. Note that because the accrued cost is not actually used for routing decisions, updating the accrued cost is an optional step if the update costs flag is not set.

As introduced above, the packet is typically not transmitted immediately. Rather, each node next independently computes a maximum delay according to the progress made by the packet on the last transmission (line 0720). In this example, node B has a remaining cost of 7 to node E and therefore the progress of the packet, which has the remaining cost set to 10, is 3. Similarly, the progress of the packet at node C is 5. This maximum delay is based on the progress such that generally, the maximum delay is smaller when the progress is larger. This approach generally gives preference to paths with the fewer hops and reduces end-to-end latency. Note that nodes B and C do not have to coordinate their retransmission of the packet, and neither is necessarily aware that the other has also received and can forward the packet.

Each of the intermediate nodes B and C next performs a loop (lines 0710-0800) that is similar to the steps executed by the originating node (see lines 0130-0170 in FIG. 3). However, before transmitting the packet for the first time the node waits a random delay that is chosen from a uniform probability distribution ranging from zero to the maximum delay that was computed according to the progress of the packet. In this version of the system, the maximum delay is set equal to ½ to the power of the computed progress (typically in the range 1 to 7) times a fixed time constant, here 24 ms. Therefore, the maximum delay at node C with progress 5 is 0.75 ms., while the maximum delay for node B with progress 3 is 3.0 ms.

In this example, we assume that the actual delay for node C, which is chosen randomly, is indeed smaller than the chosen delay for node B. Therefore node C executes the test at line 0730 before node B to check whether it has detected any other node forwarding or acknowledging the packet. Because node C has not detected such a forwarding or acknowledgment, it transmits the packet (line 0740) and begins to wait for one retransmission time (line 0750) before determining whether to proceed with further retransmissions.

When node C forwards the packet, under the assumption that node B's chosen delay is longer than node C's, node B is still waiting to do so (line 0720). We assume that node B is in range to detect node C's forwarding of the packet. Therefore, at the end of the delay when node B would have transmitted the forwarded packet, it has detected the forwarding by node C. The remaining cost in that detected forwarding from node C is 5, the cost entry in node C's cost table for destination E. Because node B's entry for destination E is 7, which is greater than 5 (line 0750) node B is aware that a closer node to the ultimate destination has already forwarded the node, and that therefore it does not have to.

Returning to originating node A, and referring again to FIG. 3, we assume that node A detects node C's forwarding of the packet, and that the forwarded packet is transmitted by node C while node A is still in its retransmission delay (line 0150). Because the remaining cost in the forwarded packet is 5, which is less than node A's cost to the destination of 10 (line 0170) node A next dequeues the packet (line 0250).

Following the packet to its ultimate destination at node E, we assume that the destination node E, as well as other intermediate nodes A, B, and D are within range of node C's forwarding of the packet. Referring to FIG. 4, destination node E processes the packet transmitted from node C according to the illustrated procedure. In this example, the packet is not flagged to update costs, and therefore node E executes the Process Packet at Destination Node procedure (line 0360), which is illustrated in FIG. 5.

Referring to FIG. 5, this is the first time that node E has received this packet (line 0510), therefore node E immediately transmits an acknowledgement packet, with the remaining cost set to zero.

Nodes A and B each receive the packet forward by node C. However, both of these nodes have costs to node E that are greater than node C, and therefore both nodes discard the detected forwarded packet (line 0610, FIG. 6).

Node D receives the packet forwarded by node C. Node D has not detected the packet being forwarded by a closer node (line 0620) and therefore may need to forward the packet. Node D's cost to node E is 4, one less than the cost from node C, and therefore the progress is 1 (line 0680). The progress is relatively small, so the delay is relatively large (line 0700). Therefore, by the time that delay has expired (line 0720), node D has detected the acknowledgement packet sent by node E, with the remaining cost of zero, which by necessity is less than node D's cost to node E (line 0730). The packet node D received from node C does not indicate than an acknowledgment is required (line 0770) and therefore node D next dequeues the packet (line 0810).

At this point, in this example the packet has traversed from node A through node C to node E, without any unnecessary transmissions

2.2 Example 2

In the first variant of Example 1, we assume that node E actually managed to receive node A's original transmission, for example, because of a momentarily favorable transmission environment. We also assume that node E transmits an acknowledgement (line 0520, FIG. 5), but only nodes C and D detect the acknowledgment, not nodes A and B. Because node B has not received the acknowledgement from node E or any retransmission of the packet, node B then transmits the packet at the end of its random delay (line 0740). We assume that B's transmission is received by nodes A, C, and D.

Nodes C and D have already received the acknowledgement for the packet with a remaining cost of zero, and therefore discard node B's forwarded packet. However, because nodes C and D have already received acknowledgement for the packet, each node transmits an acknowledgement packet in response to receiving B's forwarded packet (line 0630). Node B receives these acknowledgments and therefore dequeues the packet (line 0810). Node A receives node B's forwarded packet, and therefore dequeues the packet as having been forwarded (line 0250).

2.3 Example 3

In a second variant of Example 1, node D receives node A's original transmission along with nodes B and C. Node D then forwards the packet before the other nodes and this forwarded packet is received by B, C, and E. Therefore nodes B and C do not forward the packet. We assume that node E's acknowledgment is received by nodes B, C, and D, but not by the originating node A. Therefore, at the end of the delay of the retransmission time (line 0150), node A does not know that the packet has made it to its destination, or that it has even been transmitted one hop. Therefore node A retransmits the original packet (line 0140).

When nodes B and C receive the retransmitted packet, they have already received the forwarded packet from node D with a lower remaining cost (line 0620, FIG. 6). Therefore nodes B and C transmit acknowledgments each indicating that node's cost to destination E in remaining cost field 230 of the acknowledgment. Node A receives at least one of these acknowledgements, and therefore dequeues the packet.

2.4 Example 4

Next consider an example of a broadcast packet originating at node A with the update cost flag not set. Referring back to FIG. 2, addressing section 220 of a broadcast packet includes radius field 227 rather than destination field 226. The value of the radius field is set to a positive number by the originating node and decremented by each forwarding node. A node forwards a broadcast packet only if the received value of the radius is greater than 1. Processing of broadcast packets at intermediate nodes differs depending on whether the update costs flag is set in mode field 222 of addressing section 220.

Referring to FIG. 3, broadcast packets are first enqueued by the node for transmission indicating the desired radius of the broadcast (line 0190). The node then transmits the packet a predetermined number of time, delaying a fixed rebroadcast time between each transmission (lines 0200-0230) before it is dequeued. The node does not need to wait to detect the packet being forwarded. In this version of the system, the node rebroadcasts the packet three times (n_broadcast=3).

Each receiving node processes the packet according to the procedure shown in FIG. 7A. In general, nodes forward broadcast packets with a received radius greater than 1 after incrementing the accrued cost in the packet by the link cost of the link on which the packet was received and decrementing the radius by 1. The method of handling the packet depends on whether the update costs flag is set.

In this example, when nodes B and C each first receive the packet, because received radius is greater than 1 and the update costs flag is not set processing starts at line 1040. Nodes B and C have not previously received a copy of this packet, therefore both enqueue the packet after incrementing the accrued cost and decrementing the radius (line 1070) and initiate a loop (lines 1080-1110) retransmitting the packet. After forwarding the packet the fixed number of times, each node dequeues the packet.

Node D first receives the forwarded packet from one of nodes B and C first, and initiates the same forwarding procedure. When it receives the forwarded packet from the other of nodes B and C, it discards the packet (line 1050).

2.5 Example 5

Next consider an example in which a broadcast packet sent from originating node A with the update costs flag set. The procedure carried out by originating node A is as in the case when the update cost flag is set in Example 4.

In this example, when nodes B and C each first receives the packet, because received radius is greater than 1 and the update costs flag is set processing starts at line 0910. Nodes B and C have not previously received a copy of this packet, therefore processing continues at line 0935.

Each node updates its cost table for the cost of sending a packet from that node to the origin based on the received link cost plus the accrued_cost from the origin node (line 0935). In this example, on this reception, the accrued cost in the received packets from node A at nodes B and C is zero, and therefore nodes B and C both set their cost to A to be the received link cost of the packet just received from node A.

Each receiving node sets a delay according to the received link cost. Recall that the link cost is computed based on the signal characteristics of the transmission, and in this version is quantized to integer values from 1 to 7, with lower cost corresponding to a more reliable link. In this version of the system, the maximum delay is set to the cost minus 1 times a time constant of 4 ms. (line 0940). Therefore, delay for a cost of 1 is equal to 0 ms. while the delay for a cost of 7 is equal to 24 ms. Each node enqueues the packet (line 0950) and then waits for a random duration chose from a uniform distribution in the range from zero to the computed delay (line 0960).

During the process of forwarding a broadcast packet, the node may receive another copy of the packet. That second copy may have a different accrued cost indicated, and the link cost may be different than the first. In this version of the routing approach, if the node would forward the second copy with a lower accrued cost than the forwarding of the previous packet, the forwarding of the previously received copy of the packet is aborted if it has not already been completed. If the second copy would be forwarded with a higher or equal accrued cost, the packet is not forwarded. For example, if the node first receives the packet with an accrued cost $a_1$ with a link cost of $c_1$, forwarding of the packet indicates an accrued cost of $a_1+c_1$. If later, the node receives another copy of the broadcast packet which indicates an accrued cost of $a_2$ with a link cost of $c_2$, then that packet would be forwarded indicating an accrued cost of $a_2+c_2$. But if $a_2+c_2 \geq a_1+c_1$, then not only would the neighboring nodes have already received the packet, the second accrued cost from the origin node would be no lower and therefore the second copy of the packet is not forwarded.

Returning to the specific procedure illustrated in FIG. 7A, if at the end of the delay, an intermediate node has not received a copy of the packet that would be forwarded with a lower accrued cost (equal to the received accrued cost plus the link cost) (line 0970) it transmits the packet (line 0980). This delay and transmission is repeated for a predetermined number of times, in this version of the system, three times.

In this example, assume that node B receives the packet with cost 3 and node C receives the packet with cost 5. The maximum delay for node B is therefore 8 ms. while maximum delay for node C is 16 ms. Assume that based on the randomly chose durations, node B forwards the packet first (line 0980) and node C receives the forwarded packet.

In this example, node C receives the second copy of the packet from node B with a cost of 3 and an accrued cost of 3 indicated in the packet. Therefore the new accrued cost of the packet if node C were to forward it is 6. But node C already has the packet queued with an accrued cost of 5, and therefore node C discards the packet from node B (line 0920).

Note that in principle, a unicast packet can also be sent with the update flag set. The result is that the cost entries for the origin node at a set of nodes "near" the shortest route to the destination are updated.

3. LAYERED PROTOCOLS

The routing approach described above does not guarantee delivery of packets to their destination. Higher level protocols built on top of the network layer are responsible for features such as end-to-end acknowledgements it they are needed by an application. For example, request for an end-to-end acknowledgement may be included in the NPDU 240 (FIG. 2). When the ultimate destination of a unicast packet receives the packet, higher level protocol layers generate an acknowledgment packet for sending back to the origin.

At layers above the network layer, which is responsible for routing, a concept of a session is supported. If in the example network shown in FIG. 1, if node A wishes to communicate with node E, but it does not know the cost to send packets to E, or its cost is out of date, node A sends a broadcast packet that indicates that nodes should update their costs (to node A) when receiving the packet. The payload of the packet also includes a request of node E to establish a session. Node E in response to the request sends a unicast packet back to node A. This packet also has the update flag set. When node A receives node E's reply, the cost tables along the route support bi-directional communication between nodes A and E. As an alternative, node E's reply to node A is also a broadcast packet, thereby updating the cost to node E at a greater number of nodes of the network.

4 ALTERNATIVES 4.1 Routing layer and MAC layer interaction

The MAC layer accepts one packet at a time for transmission, and returns a status code upon completion (either successful transmission or failure, for example, maximum CSMA back off reached). When transmitting a packet from the originating node, the MAC layer is allowed to transmit immediately. When transmitting a packet at an intermediate node, the MAC layer is instructed to select an initial random back off in order to avoid transmitting simultaneously with neighboring nodes. The initial backoff is treated independently of the progress-based forwarding delay. A useful, though not necessary, feature of the MAC is the ability to cancel a previously requested transmission. This feature is used by the routing layer to reduce unnecessary transmissions, for example, if an acknowledgement is heard for the packet being processed by the MAC (e.g., avoiding transmission at line 0740 if an acknowledgment is detected at line 0730).

4.2 Cost averaging

In the cost updating approach described above, a node computes the received link cost based on the received signal-to-noise ratio of a single packet that is flagged to update costs. As an alternative, each node maintains a longer-term average of the cost of receiving packets from its neighboring nodes, and uses this average when it receives a packet flagged for it to update is cost table and to increment the accrued cost field of forwarded packets.

4.3 Proactive Cost Table Updates

Nodes can optionally exchange cost table information with their neighboring nodes, and use the received cost tables and received link costs to update their own tables. For example, rather than waiting for a packet with the update flag set to update an entry in its cost table to the origin node of that packet, the node receives one or more entries of a neighboring node's cost table. The receiving node adds the link cost for packets from the node that sent the entries to each of the costs in the entries. It then replaces any of the costs in its table for which the incremented received costs are lower.

4.4 Unidirectional Costs

In the cost update approaches described above, the cost at an intermediate node B for transmitting a packet to node A is set based on the accrued cost of sending packets from node A to node B. In systems in which the cost of transmitting packets is not symmetrical, an alternative approach may be desirable. Asymmetrical costs can occur for a number of reasons, including differences in transmission power at different nodes, or interference that is localized and affects different receivers to different degrees.

In this approach, each node periodically broadcasts a message with its radius field set to 1 that is received by its neighbors. Because the radius is set to 1, this message is not forwarded by these nodes. The message body includes a cost of receiving packets from each of the neighbors based on previous messages sent from those neighbors.

Each node maintains a table of link costs of receiving a packet transmitted by it at each of its neighbors. When a node B receives a packet from a node A that is flagged with the update costs flag, rather than adding the cost of the reception of that packet to the accrued cost indicated in the packet, it adds the cost of receiving packets at node A from node B from its table.

With this change in the update to the accrued cost, the cost table truly reflects the unidirectional cost of sending a packet to the destination node.

4.5 Communication Backbones

Figure 8:
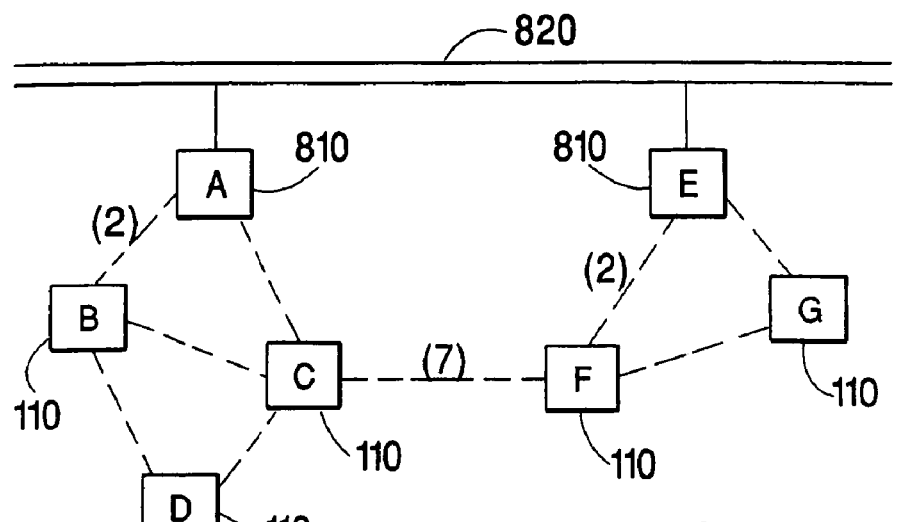
FIG. 8 is a diagram of a wireless network with some nodes linked by a wired network.

In an alternative approach, nodes may be linked by non-wireless links. For example, referring to FIG. 8 nodes A and E 810 include both a wireless and a wired interface and are linked by wired network 820, such as an Ethernet, MOD-BUS®, or a dedicated wired link. In the system, the routing and cost update algorithm described above functions as before, with the cost of communicating over the wired links being zero (or smaller than the cost of the wireless links). That is, at node A the costs in the cost table to communicate with node E is zero. In the example shown in FIG. 8, the cost of reaching node F from node E is 4 (B→A=2, A→E=0, E→F=2). When node B transmits a packet to destination node F, and this packet is received by nodes A, C and D, nodes A and C queue the packet for retransmission. Node A is cost 2 from node F so it is likely to retransmit first, which it does by passing the packet over wired network 820.

Note that should the wired network fail, connectivity between nodes B and F is maintained via the link between nodes C and F. In this way, a wireless network can serve as a backup for other nodes linked by a wired network. A non-wireless network can also serve as a monitoring and testing system for a wireless network as described in section 5 below.

4.6 Service Addressing and Service Discovery

In the approaches described above, addressing is according to identities of nodes in the network. In an alternative approach in which each node can host one or more of services, and packets are addressed to services rather than to nodes. Furthermore, the same service may be hosted at a number of different nodes. In this alternative, cost tables include entries that identify costs to send packets to the particular services. The routing algorithm then functions as described above. When a node needs a particular service, it sends a broadcast packet to that service, and a node listing that service replies, thereby locating the nearest node hosting the service.

4.7 Zoned Addressing

Figure 9:
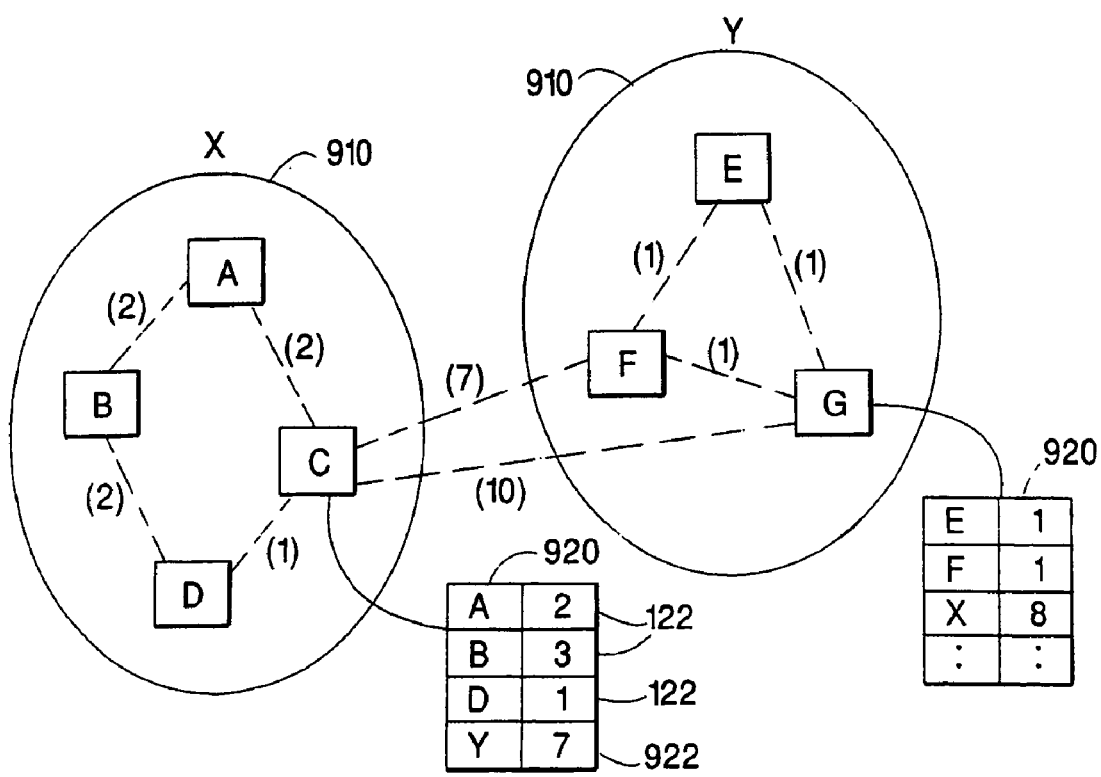
FIG. 9 is a diagram of a zoned wireless network.

In another approach, nodes are arranged in zones. For example, part of a node identification (e.g., a prefix of a numerical address) may identify the zone that the node is a member of. In such an approach, a node may not explicitly maintain a cost to every possible destination node. Referring to FIG. 9, nodes A, B, C, and D are in a zone X 910, while nodes E, F, and G are in zone Y 910. Each node maintains a cost table 920, which includes records 122 that are associated with individual nodes in its zone, and also includes records 922 that are each associated with an entire zone. The cost associated with a zone is the minimum cost to any node in that zone.

The routing algorithm and cost update algorithm described above functions similarly, with an entry in a cost table for a zone reflecting the minimum cost to a node in that zone. That is, when a node wants to transmit a packet to a node in another zone, it uses the node's identification to determine that node's zone identification, and looks up the record in the cost table according to the zone identification.

In another variant of this approach, there may be multiple level hierarchy of zones, and the cost table at a node may include zones at different levels of the hierarchy.

4.8 Link Costs and Delay Computation

Other measurements of received signals can be used as the basis for computing link costs. In CDMA systems, the signal correlation values can be used instead of a direct measurement of signal-to-noise ratio. Similarly, an absolute signal level can alternatively be used. Digital error rates, such as bit or packet error rates, can also be used as the basis for determining link costs.

An alternative approach uses costs that are based on other factors than signal quality. For example, transmissions from a power-limited node may have a higher cost than similar transmissions from a node that is not power limited. In this way, packets are preferentially routed away from power-limited nodes. Other measures of link reliability can also be used. For example, if a link is known to be periodically unavailable or known to be unreliable, its link cost can be set higher than a continuously available link.

In the approaches described above, packet retransmission is typically delayed, in part to avoid unnecessary retransmissions or to avoid collisions. Alternative approaches can be used to compute the amount to delay a packet. For instance, a deterministic rather than random delay can be used. Also, the delay or its probability distribution can be based on factors such as the absolute cost to reach the destination, a next-link cost to the destination, a geographic distance of the last link or of the distance to the destination, available power at the node, pre-configured parameters such as parameters related to the desirability of forwarding packets, or characteristics of the packet such as a priority,

4.9 Combination with Other Routing Approaches

The gradient routing approach described above can alternatively be combined with explicit routing. For example, unicast packets can be explicitly addressed to a next node on the shortest path to the destination, and a receiving node that is explicitly addressed in this way then forwards the packet without delay. Because only one node is explicitly addressed in this way, multiple nodes will not immediately forward the node and therefore immediate collisions are avoided.

In this approach, nodes that receive the packet but that are not explicitly addressed act as backups to the node on the shortest path. Should the explicitly addressed node on the shortest path fail to forward the packet, these nodes that act as backups will forward the packet to make up for the addressed node's failure to forward the packet.

5 BACKCHANNEL MODULE

In some implementations, the nodes of a wireless network include a wireless channel and a second communications channel. For example, a node includes a radio transceiver and a "backchannel module" that provides an interface to a second communications channel. A wireless network of such nodes are linked to a "backchannel network" that serves as a monitoring and testing system for the wireless network. The backchannel network can include, for example, a wired shared medium, such as an Ethernet bus.

The backchannel module generates messages in response to events occurring in the nodes. The events can include events associated with a packet, for example, when a packet is: queued, dequeued, transmitted, or received. Messages associated with such events can include a copy of a frame transmitted or received (e.g., a MAC layer frame), timestamps, the mode of the packet, the sequence number, or other information (e.g., information associated with the transport or higher layers). The events can also include events associated with the state of the node, for example, resets or reboots. The messages generated by the backchannel module can be immediately sent over the backchannel network or stored at the node for a period of time and accessed later via the backchannel network.

The messages generated by the backchannel module can also be used to compare a measured performance of a wireless network to a predicted performance based on a simulation of the wireless network. For example, a simulation of a wireless network generates a log of simulation information characterizing radio messages transmitted and received at the nodes of the wireless network (e.g., according to the gradient routing approach described above). The backchannel module generates test information from real-time monitoring of an actual wireless network corresponding to the simulated wireless network. A common data format is used for the simulation information and the test information. The test information and/or simulation information can be presented as a graphical representation of the packet flow between nodes.

Figure 10:
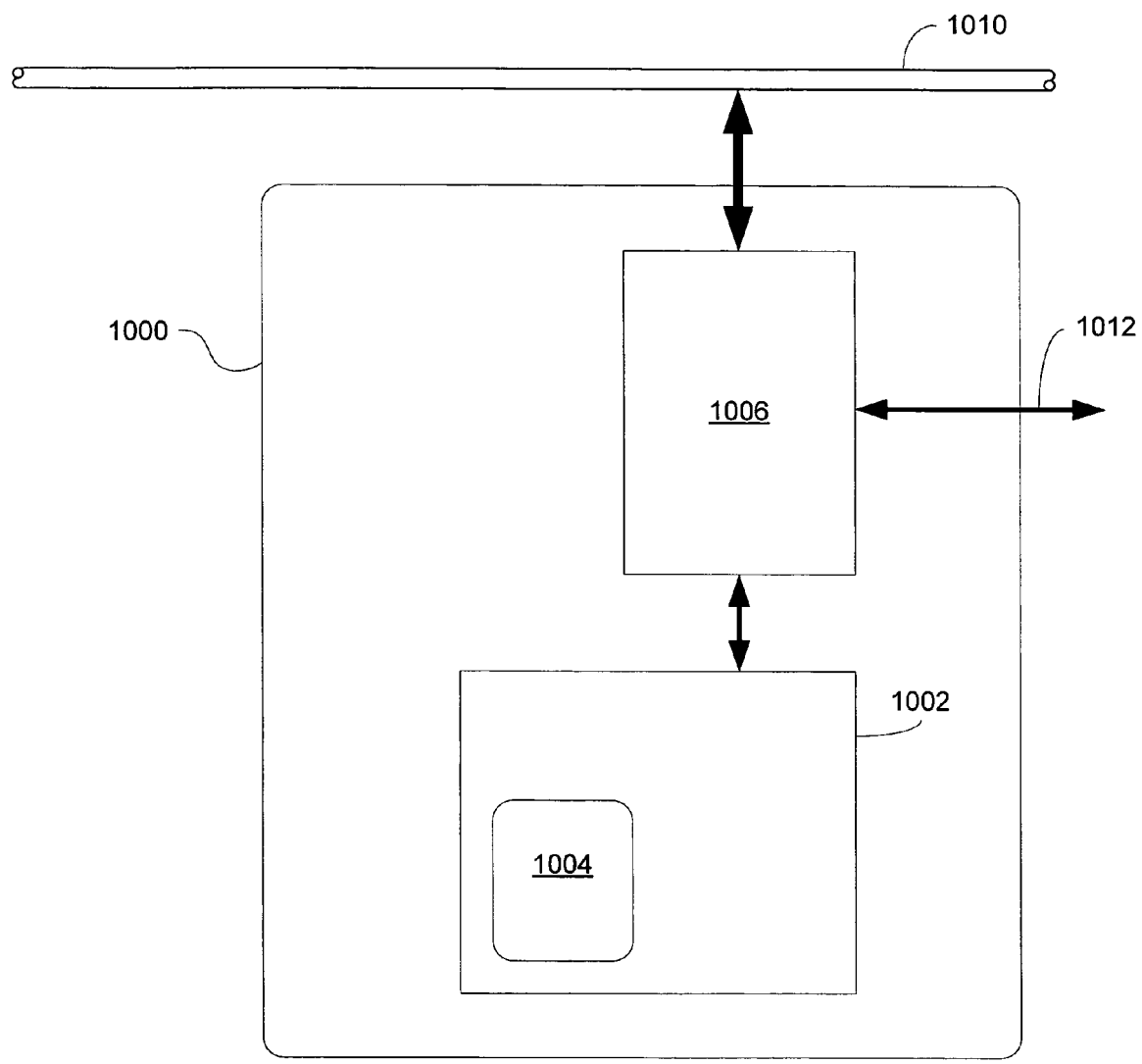
FIG. 10 is a diagram of a node that includes a backchannel module connected to a second communications channel.

Referring to FIG. 10, a node 1000 includes a communications module 1002 that includes a wireless transceiver 1004 and a backchannel module 1006 that transfers data between the communications module 1002 and an communications bus 1010 (e.g., an Ethernet bus). The backchannel module 1006 also provides a serial port 1012 for providing access to the node by other devices.

The backchannel module 1006 also provides node status information status information that can be sent over the bus 1010. For example, the available battery power or available memory at the node 1000, the state of the wireless transceiver 1004 (e.g., power level, frequency), or the state of other hardware in the node can be sent to a device coupled to the bus 1010 or a device connected to the serial port 1012.

The backchannel module 1006 can also read or write arbitrary memory locations in the communications module 1002. For example, memory locations can be read to examine entries of cost tables, a node identification number, or protocol stack information. Data can be download into the communications module 1002 over the bus 1010 or serial port 1012 via the backchannel module 1006, for example, to update or load software or firmware.

Data can also be sent to the node 1000 over the bus 1010 to control or modify the networking functions of the node 1000. For example, commands can be sent to change a power level of the wireless transceiver 1004. Control messages can include packets to insert into a queue for transmission over the wireless transceiver 1004. Data can be sent to simulate or emulate input from devices that can be interfaced with the node 1000 (e.g., temperature or motion sensors).

5.1 Backchannel Network Example

Figure 11:
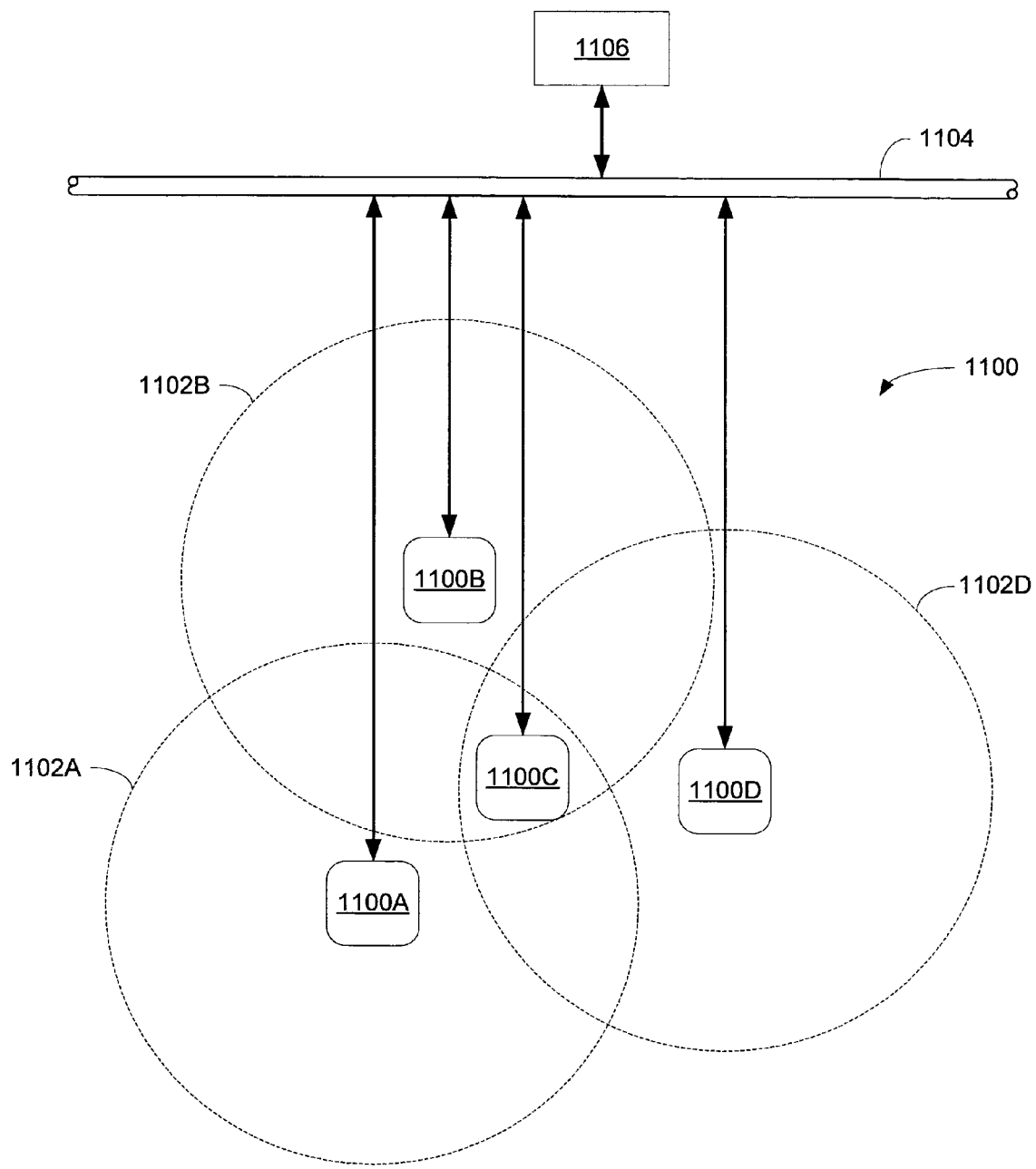
FIG. 11 is a diagram of a wireless network that includes a backchannel network.

Referring to FIG. 11, a wireless network 1100 includes four nodes 1100A-1100D that are in communication via wireless links. Node 1100A has a wireless communications range 1102A that includes node 1100C. Similarly, nodes 1100B and 1100D have wireless communications ranges 1102B and 1102D, respectively, that include node 1100C. Nodes 1100A, 100B, and 1000D can send radio messages (e.g., packets) to one another via node 1100C. The illustrated network 1100 may be a portion of a larger wireless mesh network having other nodes.

The wireless network 1100 also includes a backchannel network arranged so that the nodes 1100A-1100D are in communication over an Ethernet bus 1104. A monitoring station 1106 is connected to the backchannel network. The monitoring station 1106 combines the test information of multiple nodes, processes the information (e.g., sorting by time), and displays the information in a human readable manner (e.g., a combination of textual and graphical representations).

Alternatively, the nodes and/or monitoring station can be connected via switches, routers, or other network devices. So the backchannel network can have a topology different from the bus topology shown in FIG. 11 (e.g., a star network topology).

5.2 Monitoring Station Information Processing

The monitoring station 1106 is configured to process the information gathered over the backchannel network. Some of the processing that the monitoring station performs includes functions of a standard network protocol analyzer including, for example, decoding the protocols used in constructing a packet and displaying the names and corresponding values of the protocol fields. In addition to performing these functions, the monitoring station 1106 is configured to process the information gathered over the backchannel network in a way that enables a user (e.g., a network administrator) to identify "events" occurring at various protocol layers.

The monitoring station 1106 is able to assemble multiple packets that belong to a particular event associated with one or more layers including the MAC layer, the network layer, the transport layer, or any other layers of the network. For example, when a packet having a particular sequence number 232 is unicast across a network, multiple packet instances having the same sequence number 232 (but potentially having different values of other fields such as remaining cost 230) are transmitted between the nodes along the route to the destination. These packet instances are all associated with the same event (i.e., transmitting a packet with a particular sequence number to a particular destination node). Other information can be associated with this event including, for example, network layer and/or MAC layer acknowledgements. The monitoring station 1106 assembles this information for the event, and displays summary information for that event, such as whether the event was successful, end-to-end latency, total number of packets included in the event, etc.

Figure 12:
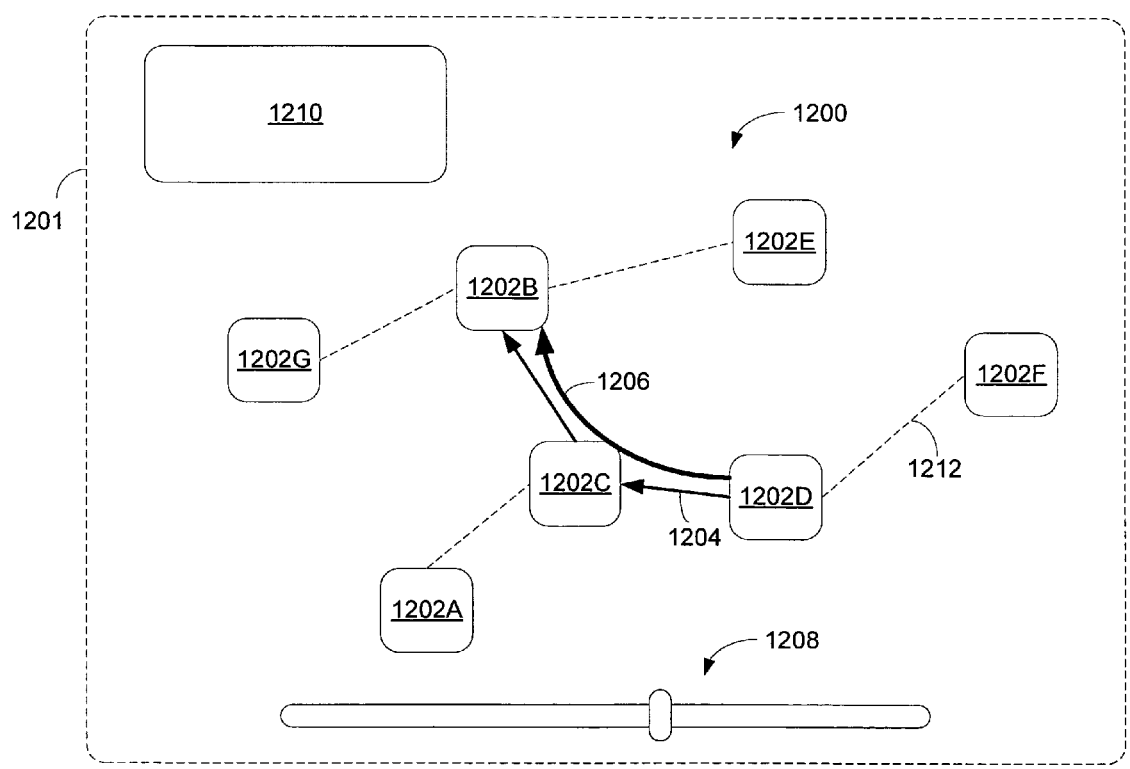
FIG. 12 is a diagram of a representation of a display area on a display.

Referring to FIG. 12, the monitoring station 1106 includes a display (not shown) that shows a network diagram 1200 that has the same topology as the monitored network in a display area 1201. The nodes of the network are represented by icons 1202A-1202G. Events can be displayed on the diagram 1200 as links or paths between the nodes.

For example, a MAC layer packet transmission is displayed as an arrow 1204 from the sending node 1202D to the receiving node 1202C. A network layer event associated with unicasting a packet is displayed as a path 1206 through the network along the route from the source node 1202D to the destination node 1202B

The events that are displayed can change according to a selected time. For example, the displayed time can be selected by moving a slider 1208. All events having associated activity within a window around the selected time are displayed. Alternatively, displayed events can be selected from a summary table 1210 listing all monitored events. Additionally, a user can select what type of events to display so that the user can visualize the flow of information through the network, for example, only at a selected layer, or at all layers simultaneously. The monitoring station 1106 can also step through time to show the flow of network traffic as a movie.

The diagram 1200 can include other types of information. For example, nodes that have been in communication but are not associated with any events during a selected time interval can be linked with a dashed line 1212.

These techniques for grouping and displaying monitored network data are especially useful for wireless mesh networks, however, these techniques can be used for any network, wired or wireless, regardless of topology. These techniques are also useful for visualizing data collected from conventional network protocol analyzers (or "packet sniffers") or for visualizing simulated data. When data is collected from multiple devices (e.g., a combination of stand-alone packet sniffers and backchannel modules), the devices synchronize their clocks with each other to assist in associating network activity with a desired event (e.g., assembling a packet trace).

5.3 On-Chip Traffic Monitoring Example

In some implementations, it is desirable to include a backchannel module on the same integrated circuit as a radio transceiver for on-chip traffic monitoring. The following example illustrates a design in which the backchannel module is able to directly monitor traffic received and transmitted from a radio transceiver.

Figure 13:
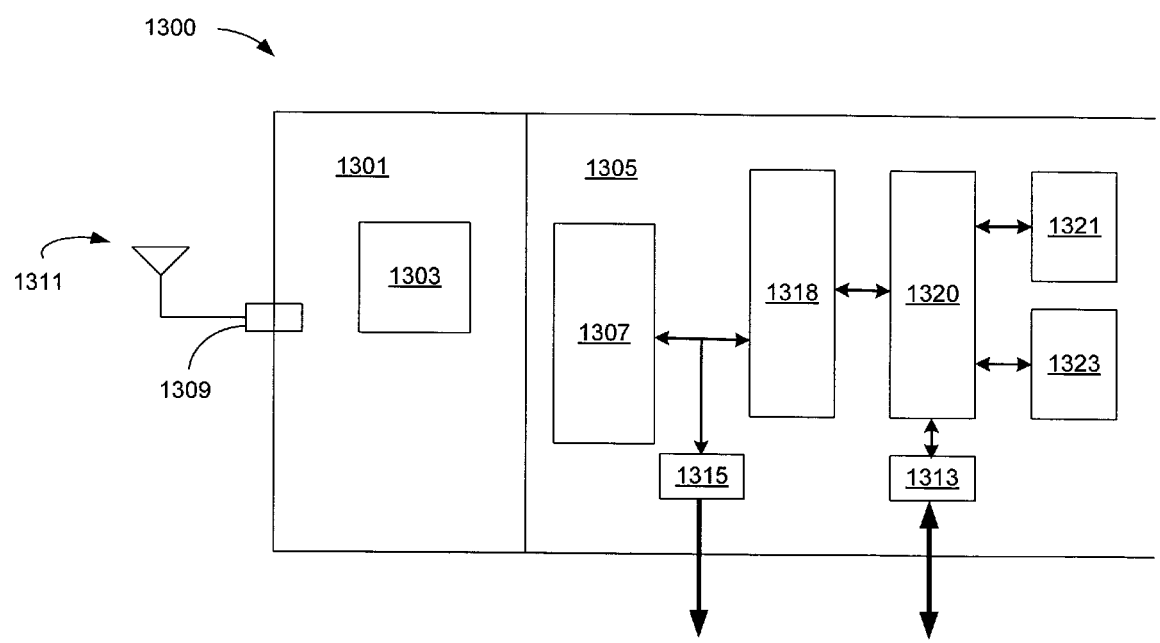
FIG. 13 is a diagram of an integrated circuit.

Referring to FIG. 13, an integrated circuit (IC) 1300 is configurable for use in a variety of wireless networking environments based on the IEEE 802.15.4 physical (PHY) and medium access control (MAC) layers including, e.g., the ZigBee™ networking environment and the EmberNet™ networking environment. The IC 1300 can be used in both full functionality devices (FFD) and reduced functionality devices (RFD). The IC 1300 uses a small number of external components to provide a radio transceiver that includes an on-chip microprocessor 1320 for execution of protocol stack software and custom application software.

The IC 1300 implements a radio transceiver containing analog circuitry 1301 including a super heterodyne receiver 1303 other frequency synthesis and timing circuitry, and digital circuitry 1305 including baseband (BB) signal processing circuitry 1307 and other data processing control circuitry. Various control signals and analog/digital conversion components provide an interface between the analog circuitry 1301 and digital circuitry 1305, as described in more detail below.

The analog circuitry 1301 includes an interface 1309 to an RF antenna 1311 for reception and transmission of RF signals. The RF antenna 1311 is provided, for example, as part of the device that incorporates the IC 1300. For RF reception, the super heterodyne receiver demodulates a received RF signal for one of a set of channels with RF frequencies near 2.4 GHz to an IF signal at approximately 4 MHz. The analog circuitry converts this IF signal to a digital signal that is further demodulated to a BB signal by the digital circuitry 1305. For RF transmission, the analog circuitry 1301 modulates an RF signal at one of the channel frequencies using Minimum Shift Key (MSK) modulation with direct sequence spread spectrum (DSSS) modulated data provided by the digital circuitry 1305.

The digital circuitry 1305 includes a microprocessor 1320 that includes a memory controller to access a flash memory module 1321 (e.g., for storing executable software) and a RAM memory module 1323 (e.g., for storing data). The microprocessor 1320 includes a serial interface 1313 that can be used to test and characterize various functions of the IC 1300. Also, the serial interface 1313 can be used to load executable software into the flash memory module 1321 either directly, or optionally, by downloading a boot program into the RAM memory module 1323 which the microprocessor 1320 uses to first download software blocks into the RAM memory module 1323 and then copy the blocks into the flash memory module 1321.

The digital circuitry 1303 also includes a lower MAC module 1318 that interfaces with the microprocessor 1320 sending and receiving packet data, and with the BB signal processing circuitry 1307 sending and receiving packets with MAC layer information (called "frames"). The lower MAC module 1318 handles various MAC layer functions including, for example, cyclic redundancy check (CRC) codes, packet acknowledgements, and backoff timing.

A backchannel module 1315 outputs copies of all of the frames sent between the lower MAC module 1318 and the BB signal processing circuitry 1307. This output enables external monitoring of traffic that is useful for debugging, for example.

Figure 14:
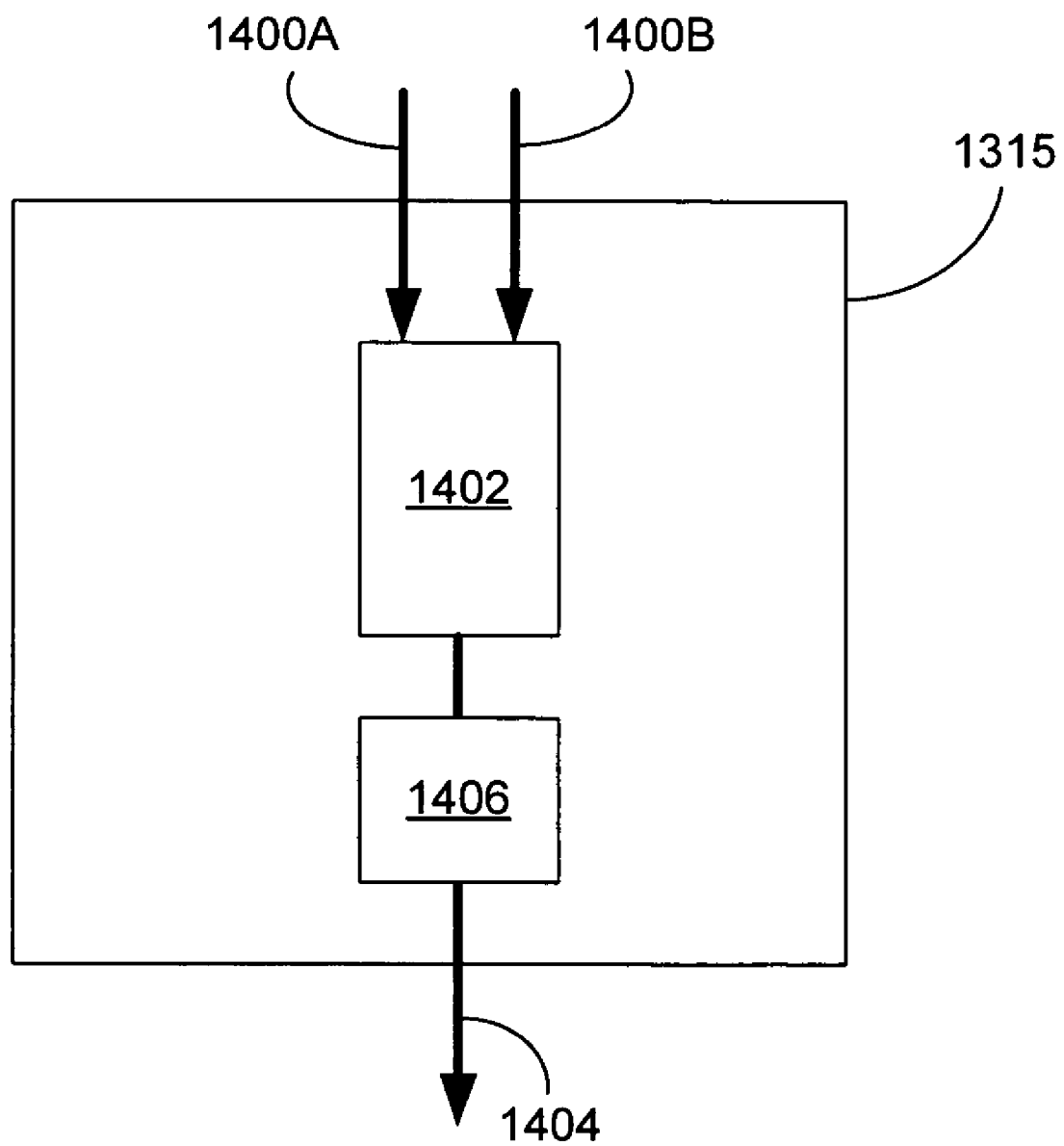
FIG. 14 is a diagram of a backchannel module.

The backchannel module 1315 monitors the frames sent from the lower MAC module 1318 to the BB transmitter 1322 and the frames sent from the BB receiver 1316 to the lower MAC module 1318. Referring to FIG. 14, the backchannel module 1315 feeds data to be transmitted over an input interface 1400A and data that has been received over and input interface 1400B to a buffer 1402 from which the data can be output from the IC 1300 over an output interface 1404. A controller 1406 determines the output of the backchannel module 1315 which optionally includes auxiliary information appended to the frame data stored in the buffer 1402. The controller 1406 can also enable or disable the monitoring and output functions of the backchannel module 1315.

In the implementation illustrated in FIG. 13, the backchannel module 1315 monitors radio messages sent between the IC 1300 and a wireless network at a location between the BB signal processing circuitry 1307 and the lower MAC module 1318. Alternatively, in other implementations, the backchannel module 1315 monitors messages at any location serving as a communication interface between the IC 1300 and the wireless network. Additionally, the backchannel module can monitor both received and transmitted messages, or only received or only transmitted messages. For example, the backchannel module 1315 can monitor messages at a location between the receiver 1303 and the BB signal processing circuitry 1307, or at a location between the RF antenna interface 1309 and the receiver 1303.

The backchannel module 1315 stores data frames that include overhead fields (e.g., a length field and a CRC field) and an encapsulated data packet. The backchannel module 1315 also stores frames without an encapsulated data packet (e.g., acknowledgement frames). The backchannel module 1315 also optionally stores information associated with each frame including dropped frames (e.g., correlator error). Thus, the backchannel module 1315 is able to output any information transmitted or received over the radio transceiver of a network node containing the IC 1300.

The output of the backchannel module 1315 can be coupled to the backchannel network. A wireless network of nodes including IC 1300 are linked to the backchannel network that serves as a monitoring and testing system for the wireless network. The backchannel network can include, for example, a wired shared medium, such as an Ethernet bus.

In an exemplary implementation of the backchannel module, the controller 1406 appends additional fields of information to each frame in the buffer 1402 and outputs the resulting augmented frames over the output interface 1404. The fields include the following six 1-byte fields: (1) received signal strength indicator (RSSI), (2) link quality indicator (LQI), (3) gain including (a) receiver RF gain (2 bits) and (b) receiver IF gain (4 bits), (4) MAC timer capture lower byte, (5) MAC timer capture middle byte, and (6) MAC timer capture upper 4 bits. Field 3 includes 2 available bits and field 6 includes 4 available bits. These total 6 available bits include the following 1-bit (Boolean) values: (i) RX or TX, (ii) filtered by MAC, (iii) RX_error, (iv) BB_RX_length error, (v) receive error overflow, (vi) CRC passed.

In this exemplary implementation, the output interface 1404 includes a DATA pin and a ENABLE pin. The DATA pin provides an output data signal at a baud rate of 500 kbps. The controller 1406 defines start, stop, and parity bits for the output data signal. The ENABLE pin provides an ENABLE signal that indicates when valid augmented frame data is present on the DATA pin. For example, the controller 1406 can account for an invalid frame that has been dropped by the BB receiver 1316 (e.g., due to correlator error). If the RX_error bit or the BB_RX_length bit is true then the controller 1406 deasserts the ENABLE signal.

Figure 15:
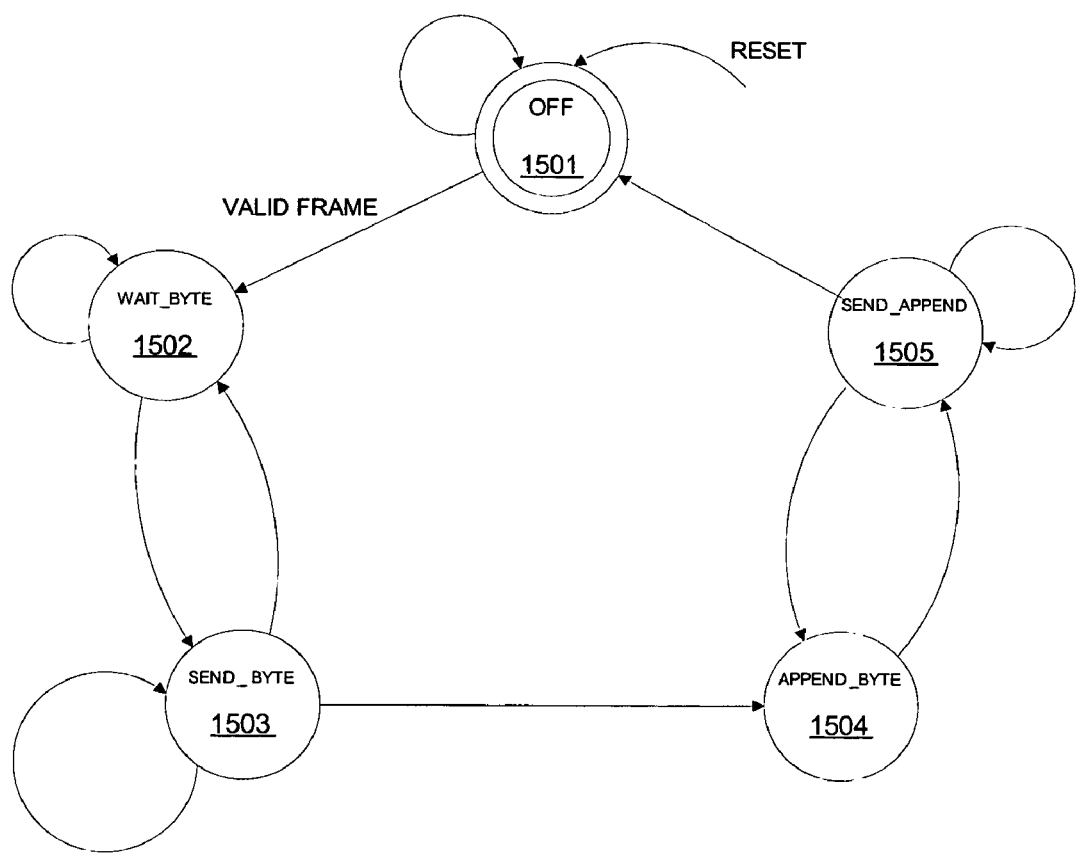
FIG. 15 is a state transition diagram.

Referring to FIG. 15, a state transition diagram 1500 for a finite state machine (FSM) controlling the backchannel module 1315 includes five states. The FSM starts in an OFF state 1501. The FSM also transitions to the OFF state 1501 after being reset. After the controller 1406 determines that valid frame data (either transmitted or received by the radio transceiver) is being received at the module 1315, the FSM transitions to a WAIT_BYTE state 1502. From the WAIT_BYTE state 1502, the FSM transitions to a SEND_BYTE state 1503 after the controller 1406 indicates that a frame byte has been stored in the buffer 1402. In the SEND_BYTE state 1503, the controller 1406 sends the byte over the DATA pin. After the byte has been sent, if the module 1315 is still receiving frame data, the FSM returns to the WAIT_BYTE state 1502. If the module is no longer receiving frame data, the FSM transitions to an APPEND_BYTE state 1504 in which the controller 1406 determines the appropriate information for the next byte to be appended. From the APPEND_BYTE state 1504, the FSM transitions to a SEND_APPEND state 1505 after the next byte to be appended has been generated. In the SEND_APPEND state 1505, the controller 1406 sends the byte over the DATA pin. After the byte has been sent, if there are remaining bytes to be appended, the FSM returns to the APPEND_BYTE state 1504. After the last byte has been appended, the FSM transitions back to the OFF state 1501.

It is to be understood that the foregoing description is intended to illustrate and not to limit the scope of the invention, which is defined by the scope of the appended claims. Other embodiments are within the scope of the following claims.

What is claimed is:

1. An apparatus comprising:
   a baseband processing unit,
   a communication interface for coupling to a wireless network, said communication interface comprising a media access control processing unit in communication with said baseband processing unit, wherein said communication interface is configured to wirelessly receive messages from at least one first node and wirelessly retransmit said messages to at least one second node;
   a backchannel module coupled between said baseband processing unit and said media access control processing unit and configured to monitor radio messages transmitted between the communication interface and the wireless network; and
   an output port for outputting monitoring data associated with the monitored messages from the backchannel module.

2. The apparatus of claim 1, wherein the messages comprise frames formatted according to a medium access control layer format.

3. The apparatus of claim 1, wherein the communication interface performs data link layer functions.

4. The apparatus of claim 3, wherein the communication interface is configured to perform medium access control layer functions.

5. The apparatus of claim 1, wherein the output port is configured to couple to a wired network.

6. The apparatus of claim 1, wherein said monitoring data is selected from the group consisting of a received signal strength indicator (RSSI), a link quality indicator (LQI), a receiver gain, and a time stamp.

7. The apparatus of claim 1, wherein said monitoring data comprises a copy of said radio messages transmitted between said communication interface and said wireless network.

* * * * *